United States Patent
Lee et al.

(10) Patent No.: US 8,038,495 B2
(45) Date of Patent: Oct. 18, 2011

(54) ORGANIC LIGHT-EMITTING DISPLAY DEVICE AND MANUFACTURING METHOD OF THE SAME

(75) Inventors: Jong Woo Lee, Yongin-si (KR); Jin Woo Park, Yongin-si (KR); Dae Ho Lim, Yongin-si (KR); Dong Soo Choi, Yongin-si (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 1033 days.

(21) Appl. No.: 11/540,157

(22) Filed: Sep. 29, 2006

(65) Prior Publication Data

US 2007/0170861 A1    Jul. 26, 2007

(30) Foreign Application Priority Data

Jan. 20, 2006 (KR) .................. 10-2006-0006149
Apr. 19, 2006 (KR) .................. 10-2006-0035455

(51) Int. Cl.
*H01J 9/00* (2006.01)
(52) U.S. Cl. .................................................. 445/23
(58) Field of Classification Search .............. 445/23–25; 313/512
See application file for complete search history.

(56) References Cited

U.S. PATENT DOCUMENTS

| | | |
|---|---|---|
| 3,966,449 A | 6/1976 | Foster |
| 4,004,936 A | 1/1977 | Powell |
| 4,105,292 A | 8/1978 | Conder et al. |
| 4,238,704 A | 12/1980 | Bonk et al. |
| 4,702,566 A | 10/1987 | Tukude |
| 4,826,297 A | 5/1989 | Kubo et al. |
| 4,984,059 A | 1/1991 | Kubota et al. |
| 5,808,719 A | 9/1998 | Fujiwara et al. |
| 5,811,927 A | 9/1998 | Anderson et al. |
| 5,965,907 A | 10/1999 | Huang et al. |
| 6,005,653 A | 12/1999 | Matsuzawa |
| 6,087,717 A | 7/2000 | Ano et al. |
| 6,109,994 A | 8/2000 | Cho et al. |
| 6,195,142 B1 | 2/2001 | Gyotoku et al. |

(Continued)

FOREIGN PATENT DOCUMENTS

CN    1290121 A    4/2001

(Continued)

OTHER PUBLICATIONS

Korean Office Action issued Feb. 12, 2007 in the counterpart Korean Patent Application No. 10-2006-0035455.

(Continued)

*Primary Examiner* — Joseph L Williams
(74) *Attorney, Agent, or Firm* — Knobbe Martens Olson & Bear LLP

(57) ABSTRACT

A preparing method of an organic light-emitting display device, completely encapsulating a substrate and an encapsulation substrate with a frit and a supplement member is disclosed. It is an aspect of the present invention to provide an organic light-emitting display device comprising: a first substrate comprising a pixel region and a non-pixel region on the side thereof wherein an organic light-emitting element is formed in the pixel region and the non-pixel region is formed in the outer side of the pixel region; a second substrate bonded to one region including the pixel region of the first substrate; encapsulating member provided between the non-pixel region of the first substrate and the second substrate and adhering the first substrate to the second substrate; and supplement member configured of resin formed to be spaced from the frit.

9 Claims, 11 Drawing Sheets

U.S. PATENT DOCUMENTS

| | | |
|---|---|---|
| 6,210,815 B1 | 4/2001 | Ooishi |
| 6,211,938 B1 | 4/2001 | Mori |
| 6,288,487 B1 | 9/2001 | Arai |
| 6,424,009 B1 | 7/2002 | Ju |
| 6,452,323 B1 | 9/2002 | Byrum et al. |
| 6,489,719 B1 | 12/2002 | Young et al. |
| 6,495,262 B2 | 12/2002 | Igeta |
| 6,515,417 B1 | 2/2003 | Duggal et al. |
| 6,551,724 B2 | 4/2003 | Ishii et al. |
| 6,554,672 B2 | 4/2003 | Dunham et al. |
| 6,555,025 B1 | 4/2003 | Krupetsky et al. |
| 6,565,400 B1 | 5/2003 | Lee et al. |
| 6,590,337 B1 | 7/2003 | Nishikawa et al. |
| 6,603,254 B1 | 8/2003 | Ando |
| 6,605,826 B2 | 8/2003 | Yamazaki et al. |
| 6,624,572 B1 | 9/2003 | Kim et al. |
| 6,646,284 B2 | 11/2003 | Yamazaki et al. |
| 6,650,392 B2 | 11/2003 | Iwanagaga et al. |
| 6,660,547 B2 | 12/2003 | Guenther |
| 6,671,029 B1 | 12/2003 | Choi |
| 6,717,052 B2 | 4/2004 | Wang et al. |
| 6,744,199 B1 | 6/2004 | Tanaka |
| 6,791,660 B1 | 9/2004 | Hayashi et al. |
| 6,831,725 B2 | 12/2004 | Niiya |
| 6,833,668 B1 | 12/2004 | Yamada et al. |
| 6,861,801 B2 | 3/2005 | Kim et al. |
| 6,878,467 B2 | 4/2005 | Chung et al. |
| 6,896,572 B2 | 5/2005 | Park et al. |
| 6,914,661 B2 | 7/2005 | Masuda et al. |
| 6,924,594 B2 | 8/2005 | Ogura et al. |
| 6,936,963 B2 | 8/2005 | Langer et al. |
| 6,956,324 B2 | 10/2005 | Yamazaki |
| 6,956,638 B2 | 10/2005 | Akiyama et al. |
| 6,965,195 B2 | 11/2005 | Yamazaki et al. |
| 6,980,275 B1 | 12/2005 | Konuma et al. |
| 6,993,537 B2 | 1/2006 | Buxton et al. |
| 6,998,776 B2 | 2/2006 | Aitken et al. |
| 7,030,558 B2 | 4/2006 | Park et al. |
| 7,098,589 B2 | 8/2006 | Erchak et al. |
| 7,112,115 B1 | 9/2006 | Yamazaki et al. |
| 7,141,925 B2 | 11/2006 | Wittmann et al. |
| 7,154,218 B2 | 12/2006 | Murakami et al. |
| 7,178,927 B2 | 2/2007 | Seo |
| 7,186,020 B2 | 3/2007 | Taya et al. |
| 7,187,121 B2 | 3/2007 | Hasegawa et al. |
| 7,193,218 B2 | 3/2007 | Nagano |
| 7,193,364 B2 | 3/2007 | Klausmann et al. |
| 7,193,366 B2 | 3/2007 | Tomimatsu et al. |
| 7,202,602 B2 | 4/2007 | Anandan |
| 7,211,938 B2 | 5/2007 | Tanaka |
| 7,214,429 B2 | 5/2007 | Kato et al. |
| 7,247,986 B2 | 7/2007 | Kang et al. |
| 7,255,823 B1 | 8/2007 | Guether et al. |
| 7,291,977 B2 | 11/2007 | Kim et al. |
| 7,306,346 B2 | 12/2007 | Fukuoka et al. |
| 7,317,281 B2 | 1/2008 | Hayashi et al. |
| 7,332,858 B2 | 2/2008 | Nomura et al. |
| 7,342,357 B2 | 3/2008 | Sakano et al. |
| 7,344,901 B2 | 3/2008 | Hawtof et al. |
| 7,359,021 B2 | 4/2008 | Ota et al. |
| 7,371,143 B2 | 5/2008 | Becken et al. |
| 7,393,257 B2 | 7/2008 | Spencer et al. |
| 7,407,423 B2 | 8/2008 | Aitken et al. |
| 7,423,375 B2 | 9/2008 | Guenther et al. |
| 7,425,166 B2 | 9/2008 | Burt et al. |
| 7,425,518 B2 | 9/2008 | Yoshida et al. |
| 7,426,010 B2 | 9/2008 | Lee et al. |
| 7,452,738 B2 | 11/2008 | Hayashi et al. |
| 7,474,375 B2 | 1/2009 | Kwak et al. |
| 7,498,186 B2 | 3/2009 | Lee |
| 7,514,280 B2 | 4/2009 | Lee |
| 7,528,544 B2 | 5/2009 | Kwak et al. |
| 7,537,504 B2 | 5/2009 | Becken et al. |
| 7,564,185 B2 | 7/2009 | Song et al. |
| 7,579,203 B2 | 8/2009 | Yamazaki et al. |
| 7,579,220 B2 | 8/2009 | Ohnuma et al. |
| 7,585,022 B2 | 9/2009 | Achilles et al. |
| 7,586,254 B2 | 9/2009 | Kwak et al. |
| 7,597,603 B2 | 10/2009 | Becken et al. |
| 7,821,197 B2 | 10/2010 | Lee |
| 7,825,594 B2 | 11/2010 | Lee et al. |
| 7,834,550 B2 | 11/2010 | Lee et al. |
| 7,837,530 B2 | 11/2010 | Park |
| 7,944,143 B2 | 5/2011 | Choi et al. |
| 2002/0024051 A1 | 2/2002 | Yamazaki et al. |
| 2002/0044253 A1 | 4/2002 | Masuda et al. |
| 2002/0084464 A1 | 7/2002 | Yamazaki et al. |
| 2002/0125816 A1 | 9/2002 | Dunham et al. |
| 2002/0125817 A1 | 9/2002 | Yamazaki et al. |
| 2003/0020124 A1 | 1/2003 | Guenther |
| 2003/0066311 A1 | 4/2003 | Li et al. |
| 2003/0077396 A1 | 4/2003 | Lecompte et al. |
| 2003/0122476 A1 | 7/2003 | Wang et al. |
| 2003/0127976 A1 | 7/2003 | Kim et al. |
| 2003/0137630 A1 | 7/2003 | Niiya |
| 2003/0218422 A1 | 11/2003 | Park et al. |
| 2003/0222061 A1 | 12/2003 | Langer et al. |
| 2003/0227252 A1 | 12/2003 | Ikeya et al. |
| 2004/0069017 A1 | 4/2004 | Li et al. |
| 2004/0075380 A1 | 4/2004 | Takemoto et al. |
| 2004/0104655 A1 | 6/2004 | Kodera et al. |
| 2004/0135520 A1 | 7/2004 | Park et al. |
| 2004/0141141 A1 | 7/2004 | Ota et al. |
| 2004/0150319 A1 | 8/2004 | Tomimatsu et al. |
| 2004/0169033 A1 | 9/2004 | Kuibira et al. |
| 2004/0169174 A1 | 9/2004 | Huh et al. |
| 2004/0201348 A1 | 10/2004 | Anandan |
| 2004/0206953 A1 | 10/2004 | Morena et al. |
| 2004/0207314 A1 | 10/2004 | Aitken et al. |
| 2004/0217703 A1 | 11/2004 | Wittmann et al. |
| 2004/0251827 A1 | 12/2004 | Kang et al. |
| 2004/0256979 A1 | 12/2004 | Murakami et al. |
| 2004/0263740 A1 | 12/2004 | Sakakura et al. |
| 2005/0001545 A1 | 1/2005 | Aitken et al. |
| 2005/0023956 A1 | 2/2005 | Kwak et al. |
| 2005/0046338 A1 | 3/2005 | Park |
| 2005/0088595 A1 | 4/2005 | Akiyama et al. |
| 2005/0092927 A1 | 5/2005 | Nagano |
| 2005/0110404 A1 | 5/2005 | Park et al. |
| 2005/0127820 A1 | 6/2005 | Yamazaki et al. |
| 2005/0174046 A1 | 8/2005 | Hasegawa et al. |
| 2005/0195355 A1 | 9/2005 | Kwak et al. |
| 2005/0200798 A1 | 9/2005 | Tanaka |
| 2005/0218396 A1 | 10/2005 | Tsuchiya et al. |
| 2005/0231107 A1 | 10/2005 | Yamazaki et al. |
| 2005/0233885 A1 | 10/2005 | Yoshida et al. |
| 2005/0248270 A1 | 11/2005 | Ghosh et al. |
| 2005/0258744 A1 | 11/2005 | Kwak et al. |
| 2005/0275342 A1 | 12/2005 | Yanagawa |
| 2006/0017382 A1 | 1/2006 | Hu et al. |
| 2006/0084348 A1 | 4/2006 | Becken et al. |
| 2006/0088951 A1 | 4/2006 | Hayashi et al. |
| 2006/0261336 A1 | 11/2006 | Ohnuma et al. |
| 2006/0284556 A1 | 12/2006 | Tremel et al. |
| 2006/0290261 A1 | 12/2006 | Sawai et al. |
| 2007/0120478 A1 | 5/2007 | Lee et al. |
| 2007/0128966 A1 | 6/2007 | Becken et al. |
| 2007/0170324 A1 | 7/2007 | Lee et al. |
| 2007/0170423 A1 | 7/2007 | Choi et al. |
| 2007/0170605 A1 | 7/2007 | Lee et al. |
| 2007/0170839 A1 | 7/2007 | Choi et al. |
| 2007/0170845 A1 | 7/2007 | Choi et al. |
| 2007/0170850 A1 | 7/2007 | Choi et al. |
| 2007/0170855 A1 | 7/2007 | Choi et al. |
| 2007/0170857 A1 | 7/2007 | Choi et al. |
| 2007/0170859 A1 | 7/2007 | Choi et al. |
| 2007/0170860 A1 | 7/2007 | Choi et al. |
| 2007/0170861 A1 | 7/2007 | Lee et al. |
| 2007/0171637 A1 | 7/2007 | Choi |
| 2007/0172971 A1 | 7/2007 | Boroson |
| 2007/0173167 A1 | 7/2007 | Choi et al. |
| 2007/0176549 A1 | 8/2007 | Park |
| 2007/0177069 A1 | 8/2007 | Lee |
| 2007/0194690 A1 | 8/2007 | Lee |
| 2007/0194710 A1 | 8/2007 | Song et al. |
| 2007/0196949 A1 | 8/2007 | Lee |

| | | |
|---|---|---|
| 2007/0197120 A1 | 8/2007 | Lee |
| 2007/0232182 A1 | 10/2007 | Park |
| 2008/0074036 A1 | 3/2008 | Wang et al. |

FOREIGN PATENT DOCUMENTS

| | | |
|---|---|---|
| CN | 1438825 | 8/2003 |
| CN | 1551686 A | 12/2004 |
| CN | 1577413 | 2/2005 |
| CN | 1617636 | 5/2005 |
| CN | 1625309 | 6/2005 |
| CN | 1212662 | 7/2005 |
| CN | 1670570 | 9/2005 |
| EP | 1 575 090 | 9/2005 |
| EP | 1 777 748 | 4/2007 |
| JP | 030-37933 | 2/1991 |
| JP | 04-147217 | 5/1992 |
| JP | 04-301879 | 10/1992 |
| JP | 06-034983 | 2/1994 |
| JP | 06-337429 | 10/1994 |
| JP | 07-074583 | 3/1995 |
| JP | 09-258671 | 3/1997 |
| JP | 09-278483 | 10/1997 |
| JP | 10-074583 | 3/1998 |
| JP | 10-125463 | 5/1998 |
| JP | 10-161137 | 6/1998 |
| JP | 63-163423 | 7/1998 |
| JP | 10-201585 | 8/1998 |
| JP | 11-007031 | 1/1999 |
| JP | 11-202349 | 7/1999 |
| JP | 2001-022293 | 1/2001 |
| JP | 2001-052858 | 2/2001 |
| JP | 2001-055527 | 2/2001 |
| JP | 2001-203076 | 2/2001 |
| JP | 2001-110564 | 4/2001 |
| JP | 2001-230072 | 8/2001 |
| JP | 2001-319775 | 11/2001 |
| JP | 2002-020169 | 1/2002 |
| JP | 2002-093576 | 3/2002 |
| JP | 2002-100472 | 4/2002 |
| JP | 2002-117777 | 4/2002 |
| JP | 2002-170664 | 6/2002 |
| JP | 2002-216951 | 8/2002 |
| JP | 2002-280169 | 9/2002 |
| JP | 2002-318547 | 10/2002 |
| JP | 2002-324662 | 11/2002 |
| JP | 2002-359070 | 12/2002 |
| JP | 2003-123966 | 4/2003 |
| JP | 2003-228302 | 8/2003 |
| JP | 2003-243160 | 8/2003 |
| JP | 2003-297552 | 10/2003 |
| JP | 2004-029552 | 1/2004 |
| JP | 2004-070351 | 3/2004 |
| JP | 04-151656 | 5/2004 |
| JP | 2004-172048 | 6/2004 |
| JP | 2004-303733 | 10/2004 |
| JP | 2004-319103 | 11/2004 |
| JP | 2005-049808 | 2/2005 |
| JP | 2005-071984 | 3/2005 |
| JP | 2005-112676 | 4/2005 |
| JP | 2005-510831 | 4/2005 |
| JP | 2005-123089 | 5/2005 |
| JP | 2005-158672 | 6/2005 |
| JP | 2005-190683 | 7/2005 |
| JP | 2005-216746 | 8/2005 |
| JP | 2005-222807 | 8/2005 |
| JP | 2005-251415 | 9/2005 |
| JP | 2005-258405 | 9/2005 |
| JP | 2005-302707 | 10/2005 |
| JP | 2005-302738 | 10/2005 |
| JP | 2005-340020 | 12/2005 |
| JP | 2006-524419 | 10/2006 |
| KR | 10-1995-0009817 | 4/1995 |
| KR | 10-1998-0017583 | 6/1998 |
| KR | 10-2000-0045292 | 7/2000 |
| KR | 10-2001-0079597 | 8/2001 |
| KR | 10-2001-0084380 | 9/2001 |
| KR | 10-2002-0051153 | 6/2002 |
| KR | 10-2003-0044656 | 6/2003 |
| KR | 10-2003-0089447 | 11/2003 |
| KR | 10-2004-0011138 | 2/2004 |
| KR | 10-2005-0024592 | 3/2005 |
| KR | 10-2005-0070543 | 7/2005 |
| KR | 10-2005-0076664 | 7/2005 |
| KR | 10-2005-0112318 A | 11/2005 |
| KR | 10-2005-0115408 | 12/2005 |
| KR | 10-2006-0005369 | 1/2006 |
| KR | 10-2006-0006148 | 1/2006 |
| KR | 10-2006-0006149 | 1/2006 |
| KR | 10-2006-0007025 | 1/2006 |
| KR | 10-2006-0007353 | 1/2006 |
| KR | 10-2006-0007354 | 1/2006 |
| KR | 10-2006-0007889 | 1/2006 |
| KR | 10-2006-0007890 | 1/2006 |
| KR | 10-2006-0007892 | 1/2006 |
| KR | 10-2006-0007893 | 1/2006 |
| KR | 10-2006-0007962 | 1/2006 |
| KR | 10-2006-0007963 | 1/2006 |
| KR | 10-2006-0008462 | 1/2006 |
| KR | 10-2006-0008463 | 1/2006 |
| KR | 10-2006-0008464 | 1/2006 |
| KR | 10-2006-0008761 | 1/2006 |
| KR | 10-2006-0008769 | 1/2006 |
| KR | 10-2006-0011831 | 2/2006 |
| KR | 10-2006-0016188 | 2/2006 |
| KR | 10-2006-0016316 | 2/2006 |
| KR | 10-2006-0016446 | 2/2006 |
| KR | 10-2006-0016856 | 2/2006 |
| KR | 10-2006-0016857 | 2/2006 |
| KR | 10-2006-0020109 | 3/2006 |
| KR | 10-2006-0025755 | 3/2006 |
| KR | 10-2006-0026816 | 3/2006 |
| KR | 10-2006-0027321 | 3/2006 |
| KR | 10-2006-0028571 | 3/2006 |
| KR | 10-2006-0035455 | 4/2006 |
| TW | 508976 | 11/2002 |
| TW | 515062 | 12/2002 |
| TW | 517356 | 1/2003 |
| TW | 564563 | 12/2003 |
| TW | 569166 | 1/2004 |
| TW | I227094 | 1/2005 |
| TW | I228686 | 3/2005 |
| TW | 200513144 | 4/2005 |
| TW | I237218 | 8/2005 |
| TW | I238026 | 8/2005 |
| TW | 200541379 | 12/2005 |
| TW | 200541382 | 12/2005 |
| TW | II277125 | 3/2007 |
| WO | WO 02/21557 | 3/2002 |
| WO | WO 2003/005774 | 1/2003 |
| WO | WO 2004/094331 | 11/2004 |
| WO | WO 2004/095597 | 11/2004 |
| WO | WO 2004/112160 | 12/2004 |
| WO | WO 2005/050751 | 6/2005 |
| WO | WO 2006/045067 | 4/2006 |
| WO | WO 2007/067420 | 6/2007 |

OTHER PUBLICATIONS

Notice of Allowance issued Jul. 3, 2007 in counterpart Korean Patent Application No. 10-2006-0035455.

Taiwanese Office Action dated Feb. 17, 2011 in corresponding application No. 095143705.

U.S. Appl. No. 11/540,150, filed Sep. 29, 2006, Song et al. and its ongoing prosecution history, including without limitation Office Actions, Amendments, Remarks, and any other potentially relevant documents.

European Extended Search Report from European Patent Application No. 07250336.0, dated Feb. 24, 2011.

European Extended Search Report from European Patent Application No. 07250317.0 dated Feb. 7, 2011.

European Search Report from European Patent Application No. 07250270.1 dated Jan. 5, 2011.

European Search Report from European Patent Application No. 07250311.3 dated Sep. 24, 2010.

European Extended Search Report from European Patent Application No. 07250267.7 dated Jan. 5, 2011.

Japanese Office Action dated Jun. 15, 2010 of the Japanese Patent Application No. 2006-151960.

Taiwanese Office Action Issued Apr. 2, 2010 from TW Application No. 95144932.
U.S. Office Action dated Nov. 29, 2010 in U.S. Appl. No. 11/529,916.
U.S. Office Action dated Mar. 24, 2011 in U.S. Appl. No. 11/540,103.
U.S Office Action dated Aug. 19, 2010 in U.S. Appl. No. 11/529,914.
Chinese Office Action issued on Jan. 8, 2010 in Patent Application No. 200710003941.0.
Taiwanese Office Action issued Jan. 18, 2010 from Application No. 95145107.
U.S. Office Action dated Mar. 29, 2010 in U.S. Appl. No. 11/541,055.
U.S. Office Action (Advisory Action) dated May 19, 2010 in U.S. Appl. No. 11/529,914.
U.S. Office Action dated May 25, 2010 in U.S. Appl. No. 11/529,995.
Chinese Office Action and English translation in corresponding Patent Application No. 200710000143.2 dated Sep. 26, 2008.
Chinese Office Action issued Oct. 10, 2008 in corresponding Patent Application No. 2007100040808.
Chinese Office Action issued Aug. 1, 2008 Patent Application No. 200710001301.6 with English translation.
Chinese Office Action issued Oct. 10, 2008 in Corresponding Patent Application No. 200710003941.0 with its English translation—11 pages.
Chinese Office Action issued Oct. 10, 2008 in Patent Application No. 200710001782.0.
Chinese Office Action issued on Aug. 1, 2008 in corresponding Patent Application No. 2007100015717 (w/English translation) in 19 pages.
Chinese Office Action Issued on Dec. 19, 2008 in Corresponding Patent Application No. 2007100072531 with its English translation—13 pages.
Chinese Rejection Decision issued on May 8, 2009 in the corresponding Patent Application No. 200710004080.8.
European Search Report from the corresponding European Patent Application No. 07101294.2 dated Jun. 6, 2007.
European Search Report from the corresponding European Patent Application No. 07101295.9 dated May 24, 2007.
Japanese Office Action dated Dec. 1, 2009 for Japanese Patent Application No. 2006-193033, which claims priority of the corresponding Korean priority Application No. 10-2006-0007893.
Japananese Office Action mailed Jun. 30, 2009 for Japanese Application No. 2006-222065.
Japanese Office Action dated Jul. 28, 2009 of the Japanese Patent Application No. 2006-153567, which claims priority of the corresponding Korean priority application No. 10-2006-0008462.
Japanese Office Action dated Jul. 28, 2009 re Patent Application No. 2006 178508.
Japanese Office Action for Patent Application No. 2006-193032 mailed May 19, 2009.
Japanese Office Action issued on May 19, 2009 in the corresponding Japanese Patent Application No. 2006-189628.
Japanese Office Action issued on Oct. 20, 2009 in the corresponding Japanese Patent Application No. 2006-189628.
Japanese Office Action issued on Oct. 27, 2009 in the corresponding Japanese Patent Application No. 2006-256002.
Japanese Office Action issued Sep. 8, 2009 in Japanese Patent Application 2007-011996.
Japanese Office Action re Patent Application No. 2006-193034 mailed May 19, 2009.
Japanese Office Action dated Jul. 14, 2009 re Patent Application No. 2006-151960.
Japanese Office Action dated Jul. 14, 2009 re Patent Application No. 2006-165210.
Korean Notice of Allowance issued Aug. 2, 2007 in counterpart Korean Patent Application No. 10-2006-0016188.
Korean Office Action from corresponding Patent Application No. 10-2006-0006148 dated Sep. 26, 2006.
Korean Office Action from corresponding Patent Application No. 10-2006-0007890, dated Sep. 26, 2006.
Korean Office Action from corresponding Patent Application No. 10-2006-0007963, dated Sep. 26, 2006.
U.S. Office Action dated Feb. 2, 2009 in U.S. Appl. No. 11/529,916.
U.S. Office Action dated Apr. 3, 2009 in U.S. Appl. No. 11/529,891.
U.S. Office Action dated Apr. 3, 2009 in U.S. Appl. No. 11/541,055.
U.S. Office Action dated Aug. 19, 2009 in U.S. Appl. No. 11/529,914.
U.S. Office Action dated Dec. 30, 2009 in U.S. Appl. No. 11/541,139.
U.S. Office Action dated Nov. 5, 2009 in U.S. Appl. No. 11/541,047.
U.S. Office Action dated Nov. 28, 2007 in U.S. Appl. No. 11/540,150.
U.S. Office Action dated Aug. 21, 2008 in U.S. Appl. No. 11/540,150.
U.S. Office Action dated Nov. 15, 2007 in U.S. Appl. No. 11/541,009.
U.S. Office Action dated Jun. 19, 2008 in U.S. Appl. No. 11/541,009.
U.S. Office Action dated Dec. 3, 2008 in U.S. Appl. No. 11/541,009.
U.S. Office Action dated Apr. 30, 2009 in U.S. Appl. No. 11/540,151.
U.S. Office Action dated Feb. 11, 2009 in U.S. Appl. No. 11/529,883.
U.S. Office Action dated Jul. 17, 2009 in U.S. Appl. No. 11/529,883.
U.S. Office Action dated Dec. 30, 2009 in U.S. Appl. No. 11/541,048.
U.S. Office Action dated Dec. 8, 2008 in U.S. Appl. No. 11/540,021.
U.S. Office Action dated Apr. 27, 2009 in U.S. Appl. No. 11/540,021.
U.S. Office Action dated Feb. 19, 2009 in U.S. Appl. No. 11/540,024.
U.S. Office Action dated May 4, 2009 in U.S. Appl. No. 11/529,995.
U.S. Office Action dated May 08, 2009 in U.S. Appl. No. 11/540,149.

IRRADIATING UV

IRRADIATING LASER

IRRADIATING UV

IRRADIATING LASER

ORGANIC LIGHT-EMITTING DISPLAY DEVICE AND MANUFACTURING METHOD OF THE SAME

CROSS-REFERENCE TO RELATED APPLICATIONS

This application claims the benefit of Korean Patent Application Nos. 10-2006-0006149, filed on Jan. 20, 2006, and 10-2006-0035455, filed on Apr. 19, 2006 in the Korean Intellectual Property Office, the disclosures of which are incorporated herein by reference.

This application is related to and incorporates herein by reference the entire contents of the following concurrently filed applications:

| Title | Filing Date | Application No. |
|---|---|---|
| ORGANIC LIGHT-EMITTING DISPLAY DEVICE WITH FRIT SEAL AND METHOD OF FABRICATING THE SAME | Sep. 29, 2006 | 11/541,055 |
| ORGANIC LIGHT-EMITTING DISPLAY DEVICE AND METHOD OF MANUFACTURING THE SAME | Sep. 29, 2006 | 11/529,914 |
| ORGANIC LIGHT EMITTING DISPLAY DEVICE | Sep. 29, 2006 | 11/541,139 |
| ORGANIC LIGHT-EMITTING DISPLAY DEVICE WITH FRIT SEAL AND REINFORCING STRUCTURE | Sep. 29, 2006 | 11/541,047 |
| ORGANIC LIGHT EMITTING DISPLAY AND METHOD OF FABRICATING THE SAME | Sep. 29, 2006 | 11/540,150 |
| ORGANIC LIGHT EMITTING DISPLAY WITH DOUBLE-LAYERED FRIT SEALING | Sep. 29, 2006 | 11/541,009 |
| ORGANIC LIGHT-EMITTING DISPLAY DEVICE WITH FRIT SEAL AND REINFORCING STRUCTURE BONDED TO FRAME | Sep. 29, 2006 | 11/540,151 |
| METHOD FOR PACKAGING ORGANIC LIGHT EMITTING DISPLAY WITH FRIT SEAL AND REINFORCING STURUTURE | Sep. 29, 2006 | 11,529,910 |
| METHOD FOR PACKAGING ORGANIC LIGHT EMITTING DISPLAY WITH FRIT SEAL AND REINFORCING STURUTURE | Sep. 29, 2006 | 11/540,084 |
| METHOD OF SEALING AN ORGANIC LIGHT-EMITTING DISPLAY BY MEANS OF GLASS FRIT SEAL ASSEMBLY | Sep. 29, 2006 | 11/540,008 |
| ORGANIC LIGHT EMITTING DISPLAY AND FABRICATING METHOD OF THE SAME | Sep. 29, 2006 | 11/541,048 |
| ORGANIC LIGHT-EMITTING DISPLAY AND METHOD OF MAKING THE SAME | Sep. 29, 2006 | 11/540,021 |
| ORGANIC LIGHT EMITTING DISPLAY AND FABRICATING METHOD OF THE SAME | Sep. 29, 2006 | 11/540,024 |
| ORGANIC LIGHT EMITTING DISPLAY DEVICE AND MANUFACTURING METHOD THEREOF | Sep. 29, 2006 | 11/529,995 |
| ORGANIC LIGHT EMITTING DISPLAY AND FABRICATING METHOD OF THE SAME | Sep. 29, 2006 | 11/540,149 |
| ORGANIC LIGHT EMITTING DISPLAY AND METHOD OF FABRICATING THE SAME | Sep. 29, 2006 | 11/529,916 |
| ORGANIC LIGHT EMITTING DISPLAY DEVICE INCLUDING A GAP TO IMPROVE IMAGE QUALITY AND METHOD OF FABRICATING THE SAME | Sep. 29, 2006 | 11/529,891 |
| ORGANIC LIGHT EMITTING DISPLAY AND METHOD OF FABRICATING THE SAME | Sep. 29, 2006 | 11/540,103 |

BACKGROUND OF THE INVENTION

1. Field of the Invention

The present invention relates to an organic light-emitting display device, and more particularly to packaging of an organic light-emitting display device.

2. Description of the Related Technology

An organic light-emitting display device is one of flat display devices. An organic light-emitting display device typically includes an organic light-emitting layer positioned between electrodes opposed to each other. Voltage is applied between the electrodes so that electrons injected from one electrode are coupled with a hole injected from the other electrode in the organic light-emitting layer. By this coupling, light-emitting molecules in the light-emitting layer are excited and returned to a ground state, thereby, emitting light.

The organic light-emitting display device according to such a light-emitting principle has excellent visibility, light weight and thinness and can further be driven with low voltage and therefore, has been spotlighted as a next generation display.

One of problems with such an organic light-emitting display device is that it deteriorates when moisture and/or impurities are infiltrated into organic materials in an organic light-emitting diode.

SUMMARY OF CERTAIN INVENTIVE ASPECTS

One aspect of the invention provides an organic light emitting display (OLED) device, comprising: a first substrate; a second substrate placed over the first substrate, wherein each of the first and second substrates is made of a single layer or comprises a plurality of layers; an array of organic light-emitting pixels interposed between the first and second substrates; and a frit seal interposed between the first and second substrates while surrounding the array, wherein the frit seal, the first substrate and the second substrate in combination define an enclosed space in which the array is located; and a reinforcing structure interposed between the first and second substrates, the reinforcing structure interconnecting the first and second substrates.

The reinforcing structure may comprise a resin. The resin may comprise one or more selected from the group consisting of epoxy, acryl, and urethane resin. The reinforcing structure may contact the frit seal. The reinforcing structure may not contact the frit seal. The reinforcing structure may be inside the enclosed space. The reinforcing structure may be outside the enclosed space. The reinforcing structure may comprise a first member and a second member, the first member being inside the enclosed space, the second member being outside the enclosed space. The first member may comprise the same material as that of the second member. The first member may comprise a material different from that of the second member.

The frit seal may comprise a plurality of elongated segments, wherein the segments in combination surround the array, and wherein the reinforcing structure extends along and substantially parallel to at least one of the segments. The reinforcing structure may comprise a plurality of elongate segments, wherein the segments in combination surround the array. Each elongated segment of the reinforcing structure may extend along and is substantially parallel to one of the elongated segments of the frit seal. The reinforcing structure may further seal the enclosed space.

Another aspect of the invention provides a method of making an organic light emitting display (OLED). The method comprises: providing a device comprising: a first substrate; a second substrate placed over the first substrate; an array of organic light-emitting pixels interposed between the first and second substrates; a frit interposed between the first and second substrates while surrounding the array, wherein the frit, the first substrate and the second substrate in combination define an enclosed space in which the array is located; and an uncured resin structure interposed between the first and second substrates and contacting the first and second substrates, wherein the uncured resin structure contacts or does not contact the frit seal; curing the uncured resin structure so as to form a reinforcing structure bonding the first and second substrates; and applying a laser or infrared beam to the frit so as to bond the frit to the first and second substrates.

In the method, the resin structure may comprise one or more selected from the group consisting of epoxy, acryl, and urethane resin. The reinforcing structure may be inside and/or outside the enclosed space. The reinforcing structure may be outside the enclosed space. Curing the uncured resin structure may comprise applying using UV or heat to the uncured resin structure. Curing the uncured resin structure may be conducted prior to applying the laser or infrared beam. Curing the uncured resin structure may be conducted subsequent to applying the laser or infrared beam.

The device may further comprise: a plurality of additional arrays of organic light-emitting pixels interposed between the first and second substrates; a plurality of additional frits interposed between the first and second substrates, each of the additional frits surrounding a respective one of the additional arrays; and a plurality of additional uncured resin structures interposed between the first and second substrates, the additional uncured resin structures being either or both of inside and outside the enclosed spaces of the additional frits.

The method may further comprise: curing the additional uncured resin structures to form a plurality of reinforcing structures interconnecting the first and second substrates; and cutting the resulting product into a plurality of pieces, each comprising a cut-portion of the first substrate, a cut-portion of the second substrate, the array of organic light-emitting pixels, the frit, and the reinforcing structure.

Another aspect of the invention provides an organic light-emitting display device comprising: a first substrate comprising a pixel region in which an organic light-emitting element is formed and a non-pixel region formed on the outer side of the pixel region; a second substrate bonded to one region including the pixel region of the first substrate; encapsulating member provided between the non-pixel region of the first substrate and the second substrate and adhering the first substrate to the second substrate; and supplement member configured of resin formed to be spaced from the frit.

Yet another aspect of the invention provides a method for preparing an organic light-emitting display device comprising a first substrate including an organic light-emitting element and a second substrate sealing at least pixel region of the substrate, the method comprising: a first step for forming a frit by applying and annealing frit paste to the outer side of the pixel region of the second substrate; a second step for applying supplement member to the side of the frit; a third step for bonding the second substrate to the first substrate; a fourth step for curing the supplement member; and a fifth step for adhering the first substrate to the second substrate by irradiating laser or infrared rays to the frit.

Still another aspect of the invention provides a method for preparing an organic light-emitting display device in plural at a time, which comprises first substrates including organic light-emitting elements and second substrates sealing at least pixel region of the first substrates, the method comprising: a first step for forming a frit by applying and annealing frit paste to the respective outer sides of a second substrate original sheet on which the plurality of the second substrates are formed; a second step for applying supplement member to the side of the respective frits; a third step for bonding the second substrate original sheet to a first substrate original sheet on which the plurality of the first substrates are formed; a fourth step for curing the supplement member; a fifth step for adhering the first substrates to the second substrates by irradiating laser or infrared rays to the respective frits; and a sixth step for cutting the first substrate original sheet and the second substrate original sheet bonded to each other and separating them into an individual organic light-emitting display device.

Another aspect of the invention provides a method for preparing an organic light-emitting display device comprising a first substrate including an organic light-emitting element, and a second substrate sealing at least pixel region of the substrate, the method comprising: a first step for forming a frit by applying and annealing frit paste to the outer side of the pixel region of the second substrate; a second step for applying supplement member to the side of the frit; a third step for bonding the second substrate to the first substrate; a fourth step for adhering the first substrate to the second substrate by irradiating laser or infrared rays to the frit; and a fifth step for curing the supplement member.

Another aspect of the invention provides a method for preparing an organic light-emitting display device in plural at a time, which comprises first substrates including organic light-emitting elements and second substrates sealing at least pixel region of the first substrates, the method comprising: a first step for forming a frit by applying and annealing frit paste to the respective outer sides of a second substrate original sheet on which the plurality of the second substrates are formed; a second step for applying supplement member to the side of the respective frits; a third step for bonding the second substrate original sheet to a first substrate original sheet on which the plurality of the first substrates are formed; a fourth step for curing the supplement member; a fifth step for adhering the first substrates to the second substrates by irradiating laser or infrared rays to the respective frits; and a sixth step for cutting the first substrate original sheet and the second substrate original sheet bonded to each other and separating them into an individual organic light-emitting display device.

According to the method for preparing an organic light-emitting display device, the supplement member encapsulates the frit and the encapsulation substrate, and reinforces packaging of the organic light-emitting display device when using the frit. In addition, the supplement member protects the organic light-emitting element from ambient air.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF CERTAIN INVENTIVE EMBODIMENTS

Hereinafter, embodiments according to the invention will be described with reference to the accompanying drawings.

An organic light emitting display (OLED) is a display device comprising an array of organic light emitting diodes. Organic light emitting diodes are solid state devices which include an organic material and are adapted to generate and emit light when appropriate electrical potentials are applied.

Figure 8A:
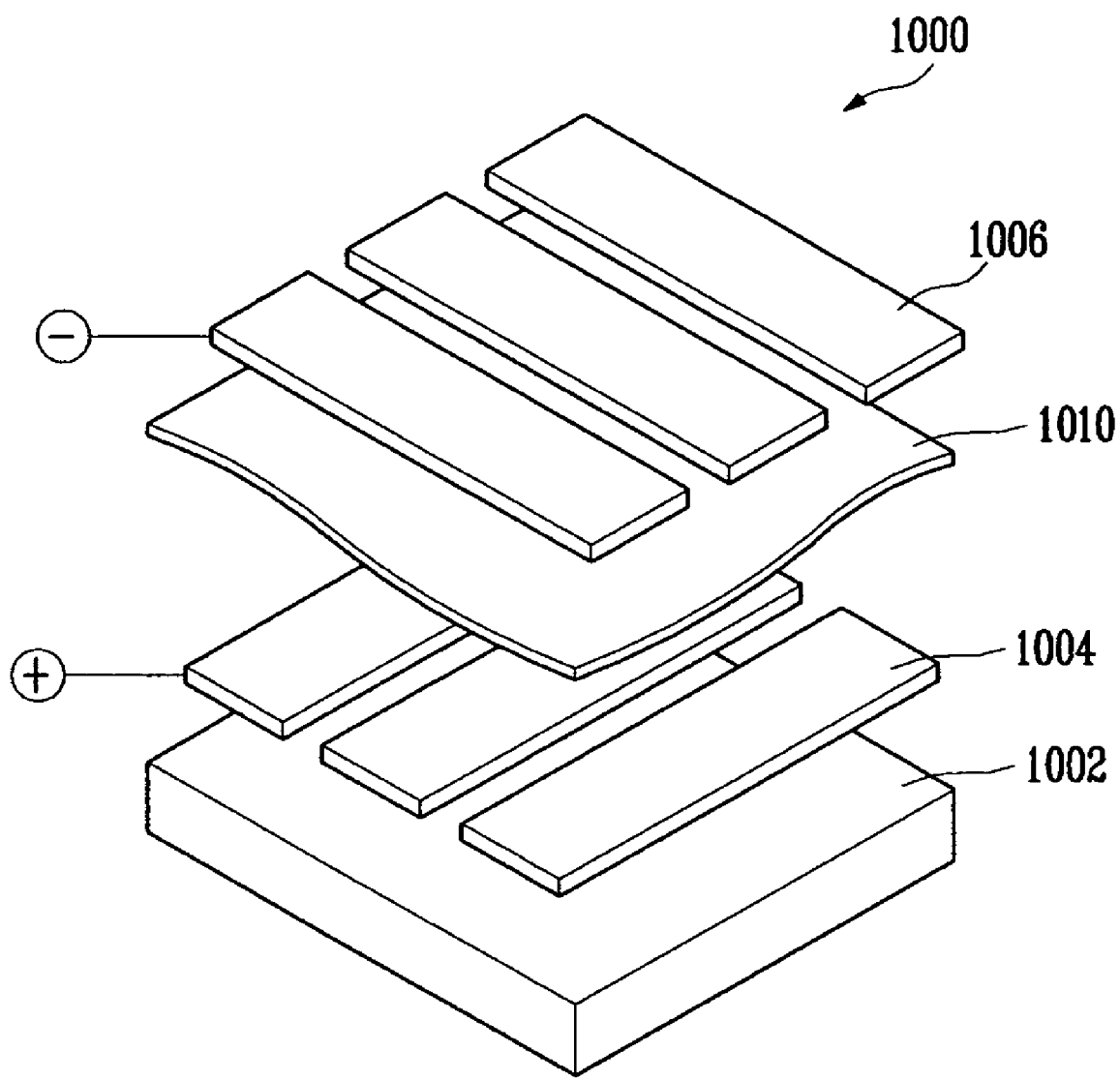
FIG. 8A is a schematic exploded view of a passive matrix type organic light emitting display device in accordance with one embodiment.
Figure 8B:
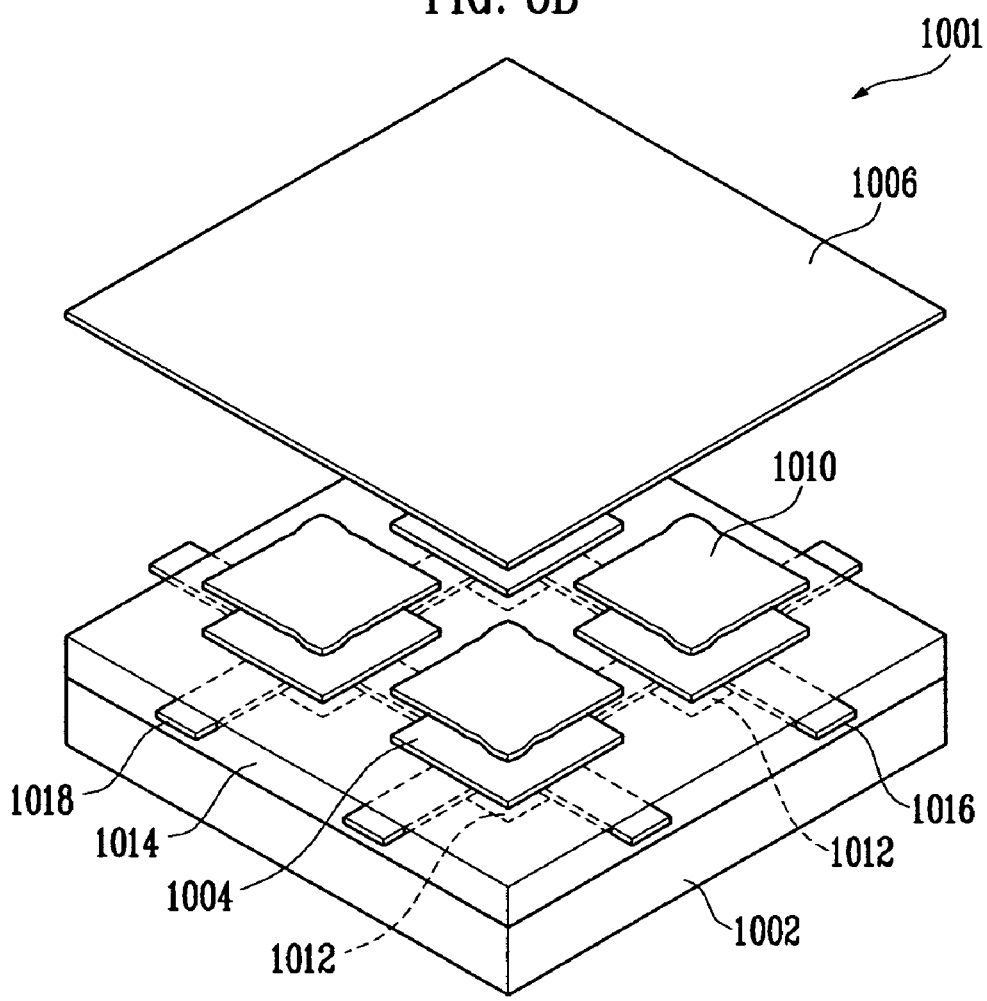
FIG. 8B is a schematic exploded view of an active matrix type organic light emitting display device in accordance with one embodiment.

OLEDs can be generally grouped into two basic types dependent on the arrangement with which the stimulating electrical current is provided. FIG. 8A schematically illustrates an exploded view of a simplified structure of a passive matrix type OLED 1000. FIG. 8B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 8A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 8B, the active matrix OLED (AMOLED) includes driving circuits 1012 arranged between the substrate 1002 and an array of OLED pixels. An individual pixel of AMOLEDs is defined between the common cathode 1006 and an anode 1004, which is electrically isolated from other anodes. Each localdriving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 8C:
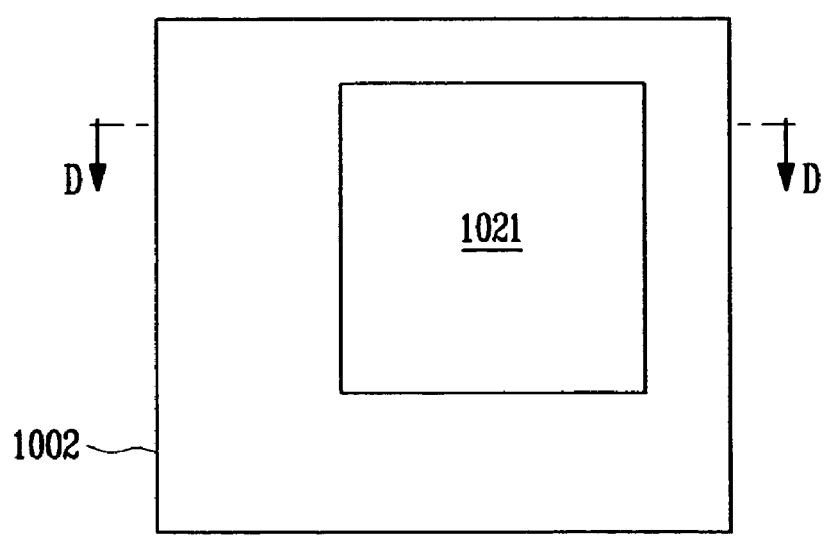
FIG. 8C is a schematic top plan view of an organic light emitting display in accordance with one embodiment.

In many embodiments, an OLED pixel array 1021 comprising a plurality of organic light emitting pixels is arranged over a substrate 1002 as shown in FIG. 8C. In embodiments, the pixels in the array 1021 are controlled to be turned on and off by a driving circuit (not shown), and the plurality of pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 8D:
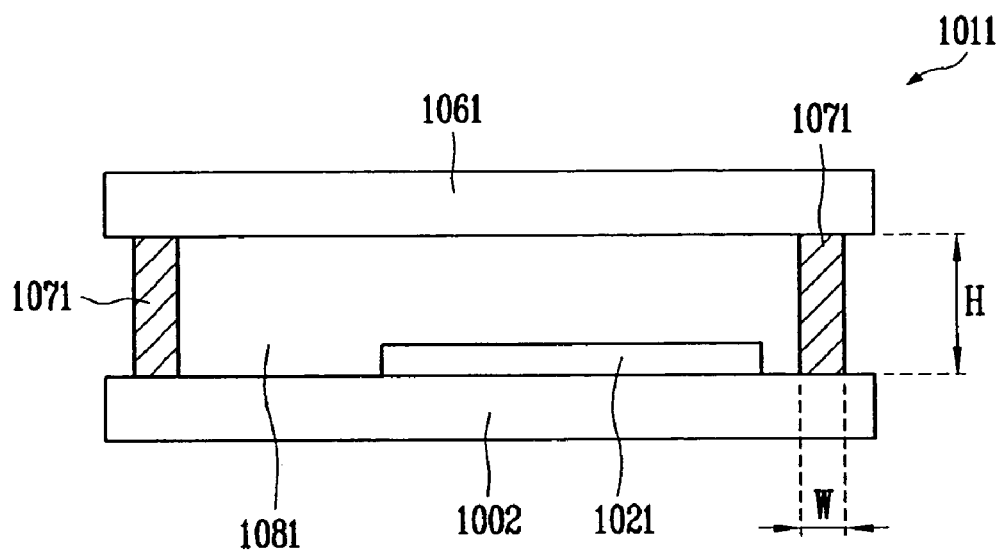
FIG. 8D is a cross-sectional view of the organic light emitting display of FIG. 8C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 8D schematically illustrates a cross-section of an encapsulated OLED device 1011 having a layout of FIG. 8C and taken along the line d-d of FIG. 8C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 8D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 8D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 µm to about 30 µm, optionally about 5 µm to about 10 µm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 8E:
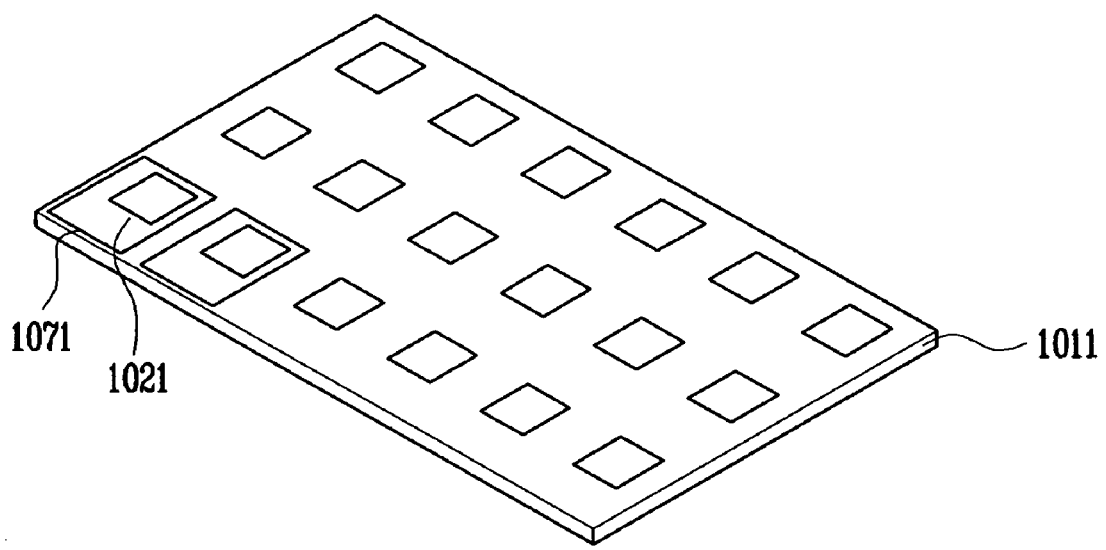
FIG. 8E is a schematic perspective view illustrating mass production of organic light emitting devices in accordance with one embodiment.

In some embodiments, OLED devices 1011 are mass produced. In an embodiment illustrated in FIG. 8E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 8D. In certain embodiments, the individual OLED devices 1011 then further undergo additional packaging operations to further improve the sealing formed by the frit seal 1071 and the top and bottom substrates 1061, 1002.

Figure 1:
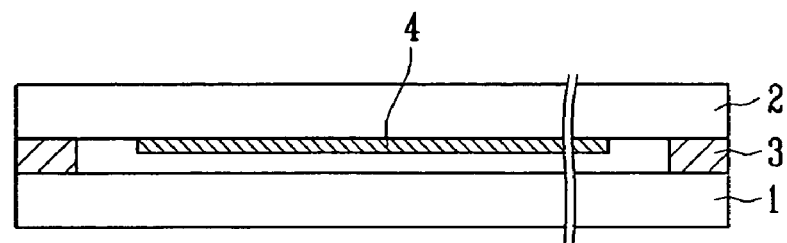
FIG. 1 is a cross-sectional view of an organic light-emitting display device.

FIG. 1 is a cross-sectional view illustrating a sealing structure of the organic light-emitting diode. Referring to FIG. 1, the organic light-emitting display device comprises a depositing substrate 1, an encapsulation substrate 2, encapsulating member 3 and moisture absorbent 4. The depositing substrate 1 is a substrate that comprises a pixel region including at least one organic light-emitting diode and a non-pixel region surrounding the pixel region. The encapsulation substrate 2 is oppositely adhered to the side in which the organic light-emitting diode of the depositing substrate 1 is formed.

The encapsulating member 3 is applied along the edge of the depositing substrate 1 and the encapsulation substrate 2 in order to adhere the depositing substrate 1 to the encapsulation substrate 2. The encapsulating member 3 is cured by means of ultraviolet rays irradiating method, etc. Because hydrogen, oxygen, moisture, etc., may be infiltrated through fine cracks even though the encapsulating member 3 is applied, the moisture absorbent 4 is included within the encapsulation substrate 2 for removing them.

However, the encapsulating member 3 cannot completely prevent the infiltration of the ambient air. In addition, the moisture absorbent 4 is coated on the encapsulation substrate by an annealing process which it causes outgassing. Thus, the annealing process may decrease adhesion between the encapsulating member 3 and the substrates, allowing the organic light-emitting diode to be easily exposed to the ambient air.

In one embodiment, an organic light-emitting diode is encapsulated by applying a frit to a glass substrate without having moisture absorbent. According to this, since the space between the substrate and the encapsulation substrate is completely sealed by curing a melted frit, the moisture absorbent is not required and the organic light-emitting diode can be more effectively protected.

However, because the frit material is fragile, stress concentration phenomenon occurs on the adhesive surface of the frit and the substrate when external impact is applied, thereby causing cracks to be generated from the adhesive surface and spread into the entire substrate.

Figure 2:
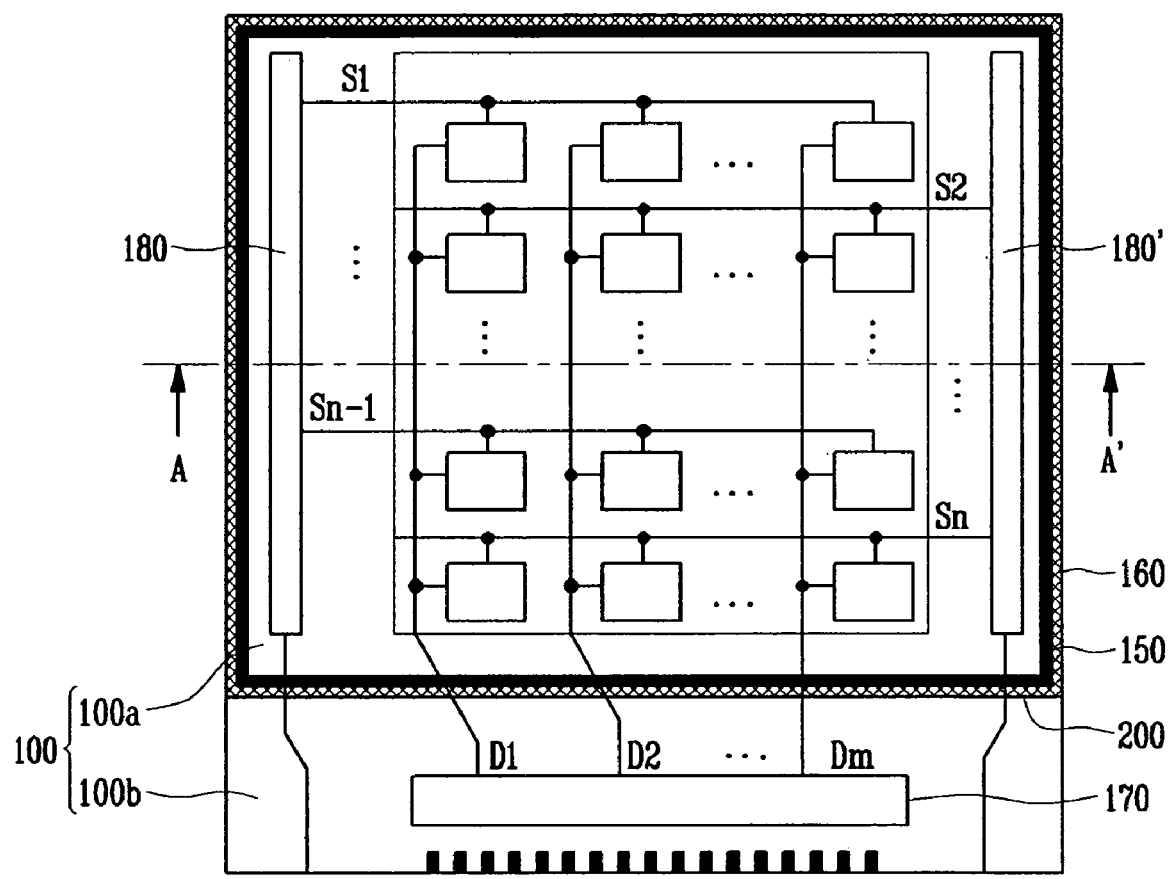
FIG. 2 is a plan view of an organic light-emitting display device according to one embodiment.
Figure 3:
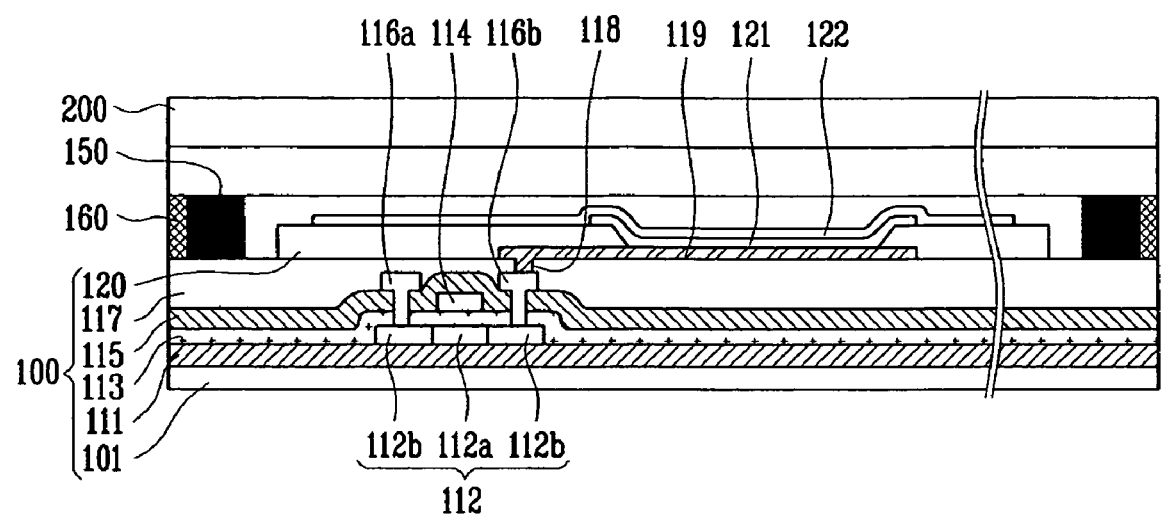
FIG. 3 is a cross-sectional view of the organic light-emitting display device of FIG. 2, taken along the A-A' line in FIG. 2.

FIG. 2 is a plan view of an organic light-emitting display device according to one embodiment. FIG. 3 is a cross-sectional view of the organic light-emitting display device, taken along the A-A' line of FIG. 2. The organic light-emitting display device comprises a substrate 100, an encapsulation substrate 200, encapsulating member 150 and supplement member 160. In the context of this document, a substrate 100 refers to a substrate including an organic light-emitting element. The substrate 100 may be single-layered or multi-layered. A depositing substrate 101 refers to a base substrate on which an organic light-emitting element is formed.

The substrate 100, which is a plate including an organic light-emitting element, comprises a pixel region 100a and a non-pixel region 100b surrounding the pixel region 100a. The pixel region 100a includes at least one organic light-emitting element having a first electrode 119, an organic layer 121 and a second electrode 122. In the explanation of the following specification, the pixel region 100a refers to a region in which a predetermined image is displayed by light emitting from the organic light-emitting element, and the non-pixel region 100b refers to all regions outside the pixel region 100a on the substrate 100.

The pixel region 100a includes a plurality of scan lines (S1 to Sm) arranged in a row direction and a plurality of data lines (D1 to Dm) arranged in a column direction. A plurality of pixels receiving a signal from a driver integrated circuit 300 for driving the organic light-emitting elements are formed at intersections between the scan lines (S1 to Sm) and the data lines (D1 to Dm).

Also, in the non-pixel region 100b driver IC for driving the organic light-emitting elements; and metal wirings electrically connected to the scan lines (S1 to Sm) and the data lines (D1 to Dm) of the pixel region, respectively, are formed. In the illustrated embodiment, the driver IC includes a data driver 170 and scan drivers 180,180'.

The illustrated organic light-emitting element is driven in an active matrix type. The structure thereof will be schematically explained.

A buffer layer 111 is formed on a base substrate 101. The buffer layer 111 is made of insulating material such as silicon oxide SiO2 or silicon nitride Sinx, etc. The buffer layer 111 is formed to protect the substrate 100 from damages due to factors such as heat from outside.

On at least any one region of the buffer layer 111, a semiconductor layer 112 comprising an active layer 112a and an ohmic contact layer 112b is formed. On the semiconductor layer 112 and the buffer layer 111, a gate insulating layer 113 is formed, and on one region of the gate insulating layer 113, a gate electrode 114 having the size corresponding to the width of the active layer 112 is formed.

An interlayer insulating layer 115 is formed on the gate insulating layer 113 including the gate electrode 114, and source and drain electrodes 116a, 116b are formed on a predetermined region on the interlayer insulating layer 115.

The source and drain electrodes 116a, 116b are formed to connect to the ohmic contact layer 112b, and a planarization layer 117 is formed on the interlayer insulating layer 115 including the source and drain electrodes 116a, 116b.

On one region of the planarization layer 117, a first electrode 119 is formed. The first electrode 119 is connected to one region exposed to any one of source and drain electrodes 116a, 116b through a via hole 118.

On the planarization layer 117 including the first electrode 119, a pixel defining film 120 having an opening (not shown) exposing at least one region of the first electrode 119 is formed.

In the opening of the pixel defining film 120, an organic layer 121 is formed. A second electrode layer 122 is formed over the pixel defining film 120 and the organic layer 121. A passivation layer can be further formed on an upper surface of the second electrode layer 122.

The embodiments may apply to either an active matrix structure or an passive matrix structure of the organic light-emitting elements. A skilled artisan will appreciate that such structures may be modified. The respective structures are well known, and therefore, the detailed explanation thereof will be omitted.

The encapsulation substrate 200, which is a member for sealing at least the pixel region 100a of a substrate on which the organic light-emitting element is formed, can include a transparent material in the case of front side light-emitting or both sides light-emitting. Alternatively, the encapsulation substrate may be made of an opaque material in the case of rear side light-emitting. An exemplary material for the encapsulation substrate 200 may be, but are not limited to, glass in the case of the front side light-emitting.

The encapsulation substrate 200 in a plate form in the illustrated embodiment, seals at least the pixel region in which organic light-emitting element is formed. For example, in the illustrated embodiment, all regions other than the data driver and the pad part are sealed.

The frit 150, which is formed in the space between the encapsulation substrate 200 and the non-pixel region 100b of the substrate 100, encapsulates the pixel region 100a so that ambient air cannot be infiltrated. The frit may refer to glass raw material including additives in the form of a powder. It may also refer to glass formed by melting the frit. In the context of this document, "frit" may refer to either of them.

The frit 150 is formed to form a closed line by being spaced from an edge of the side wherein the encapsulation substrate 200 is bonded to the substrate 100 at regular intervals.

The frit 150, which includes glass material, absorber for absorbing laser, and a filler for reducing thermal expansion coefficient, is applied to the encapsulation substrate 200 in a frit paste state. Then, the frit 150 is melted and cured between the encapsulation substrate 200 and the substrate 100 by laser or infrared rays, encapsulating the encapsulation substrate 200 and the substrate 100.

In one embodiment, a compound containing a transition metal is included as absorber. An example of such material may include $V_2O_5$.

In one embodiment, the line formed by the frit 150 is from about 0.5 mm to about 1.5 mm in width. The thickness of the frit 150 may be from about 10 to about 20 µm.

Meanwhile, the constitution and the material of the side of the substrate 100 with which the frit 150 is directly contacted are not limited to the embodiment described above. In one embodiment, the sections other than the section of the metal wiring directly connected with a driver integrated circuit do not overlap with metal wiring. Since the frit 150 is irradiated with laser or the infrared rays as described above, the metal wiring may be damaged when the frit 150 overlaps with the metal wiring.

The supplement member 160, which is formed on the side of the frit 150, prevents the organic light-emitting display device from easily breaking when all of the substrate 100, the encapsulation substrate 200 and the frit 150 are glass. The supplement member 160 also serves as an encapsulating member when the frit 150 is not adhered by being melted or when its adhesion is weak. The supplement member 160 can be spaced apart from the frit 150 by a predetermined gap. In other embodiments, the supplement member 160 may contact the frit 150.

As a material of the supplement member 160, resins that are self-cured, thermally-cured or UV-cured can be used. For example, the self-curable resin includes acrylate cyanide. Acrylate is a material thermally curable at a temperature less than about 80° C. Epoxy, acrylate and urethane acrylate may be UV cured.

Figure 4:
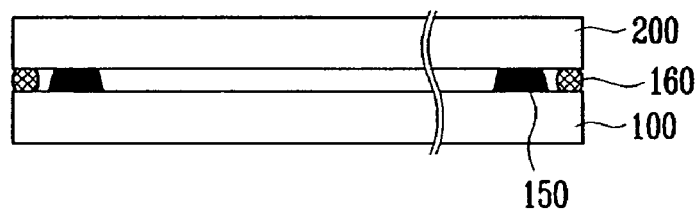
FIG. 4 is a cross-sectional view of an organic light-emitting display device according to another embodiment.
Figure 5:
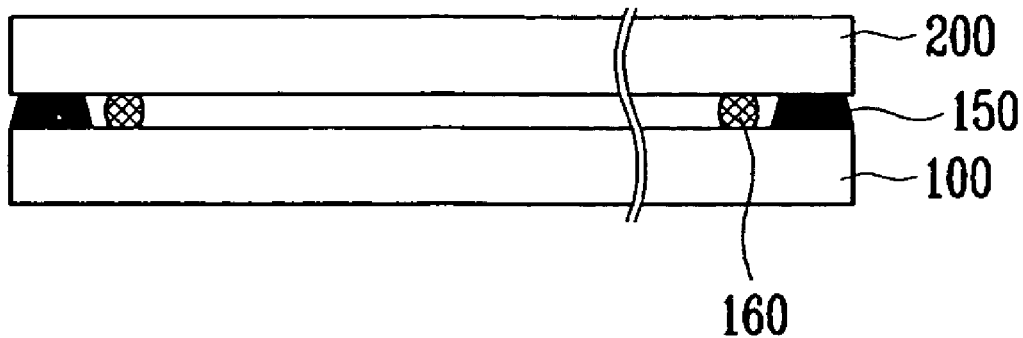
FIG. 5 is a cross-sectional view of an organic light-emitting display device according to another embodiment.

Meanwhile, unlike the embodiment in FIG. 3, FIG. 4 and FIG. 5 illustrate a schematic view of an organic light-emitting display device wherein the supplement member is formed on the respective inner side and outer side the organic light-emitting display device by being spaced from the frit. With such embodiments, it will be appreciated by a person having ordinary skill in the art that the supplement member can contact the frit or can be spaced therefrom. The supplement member may be formed on the inner side, the outer side or the both sides of the frit.

The foregoing organic light-emitting display device can be prepared in various methods, however it will be described based on the first embodiment of the preparing method by referring to FIGS. 6a to FIG. 6e. FIGS. 6a to FIG. 6e illustrate a process of making an organic light-emitting display device.

Figure 6A:
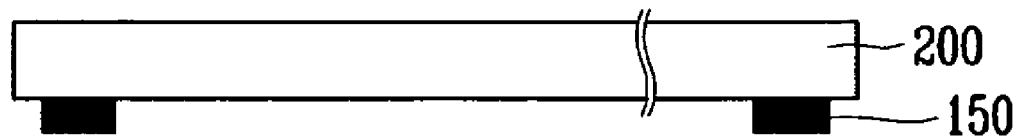
FIG. 6a to FIG. 6e are cross-sectional views showing a preparing process of an organic light-emitting display device according to one embodiment.

First, the frit 150 is applied to peripheral portions spaced a predetermined distance from the edge of the encapsulation substrate 200. The frit 150 is formed on a position corresponding to a non-pixel region of a substrate which will be described later. The frit 150 is applied to the encapsulation substrate 200 in a paste form and is cured by annealing after moisture or organic binder included in the paste is removed. (FIG. 6a)

Figure 6B:
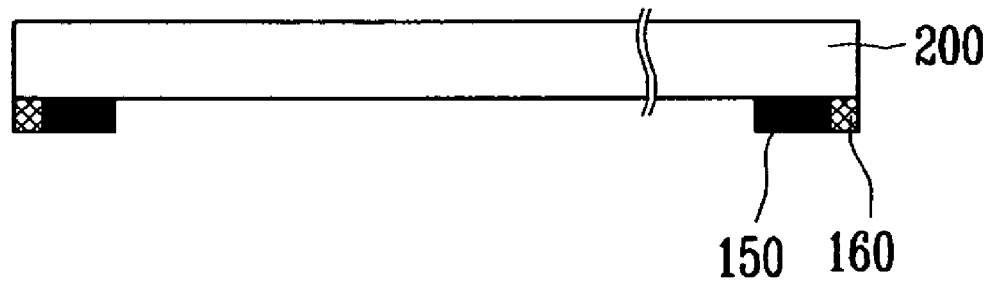

Next, referring to FIG. 6b, the supplement member 160 including a resin is applied along the outer side of the applied frit paste. The supplement member 160 may be formed by a dispensing or screen printing method. The supplement member 160 can be formed by being spaced from the frit 150 at a predetermined interval or contacting the frit 150. Also, the supplement member 160 may align with the edge of the encapsulation substrate 200 or may be formed inside from the edge.

Figure 6C:
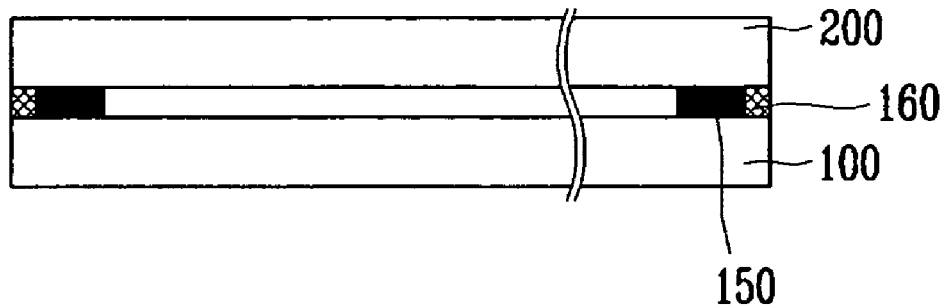

Next, the substrate 100 including a pixel region including an organic light-emitting element and a non-pixel region in which a driving integrated circuit and a metal wiring, etc., are formed is provided. The substrate 100 is bonded to the encapsulation substrate 200, enclosing the section including the pixel region. (FIG. 6c)

Figure 6D:
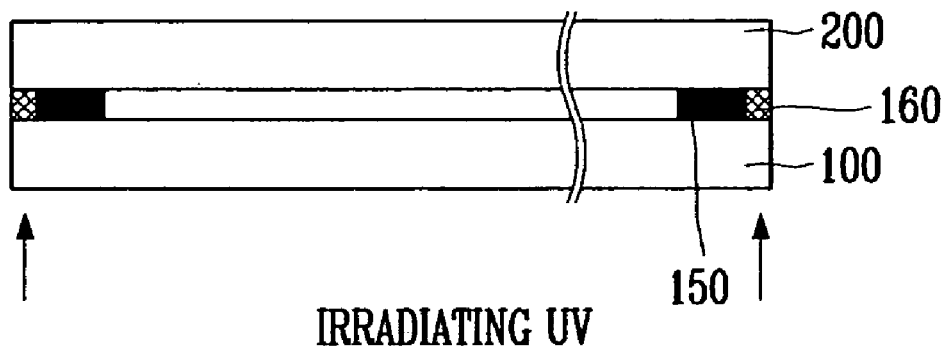

Next, the supplement member 160 is cured between the bonded substrate 100 and the encapsulation substrate 200. When the material of supplement member 160 is ultraviolet rays curing, it is irradiated with ultraviolet rays after masking. When the material of supplement member 160 is thermosetting, the supplement member 160 is irradiated with heat. In case of curing by heat, since high temperature causes fatal damages to an organic light-emitting element. In one embodiment, the temperature is about 80° C. or less. (FIG. 6d)

Figure 6E:
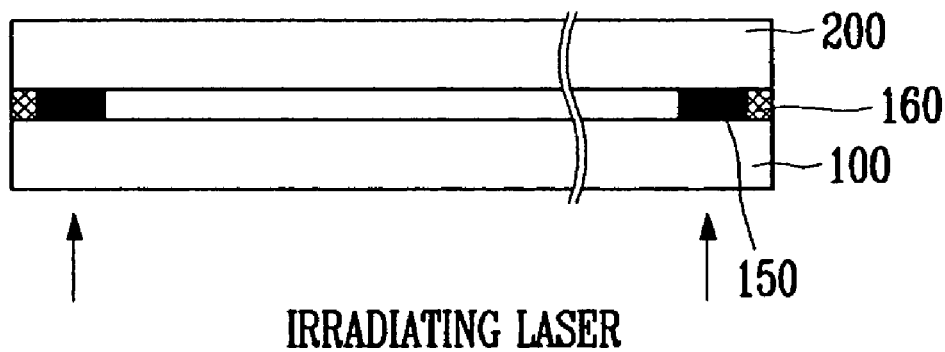

Next, the frit 150 between the substrate 100 and the encapsulation substrate 200 bonded to each other is irradiated with laser or infrared rays. As a result, the frit 150 is melted between the substrate 100 and the encapsulation substrate 200. In one embodiment, the frit 150 is melted by laser or infrared rays. The wavelength of the laser or infrared rays to be irradiated may be from about 800 mm to about 1200 mm (optionally, 810 nm). The beam size may be from about 1.0 nm to about 3.0 nm in diameter. The output electric power may be from about 25 watt to about 45 watt. The part other than the frit 150 is to be masked. As a material for masking, a double film of copper and aluminum can be used. Thereafter, the melted frit 150 adheres the substrate 100 to the encapsulation substrate 200, while being cured. (FIG. 6e)

Meanwhile, the second embodiment of the preparing method of the organic light-emitting display device provides a method switching the step of curing the supplement member with the step of irradiating the frit by laser. A person having ordinary skill in the art will appreciate that the supplement member can be cured after melting/curing the frit.

The foregoing preparing method is a preparing method for preparing an individual organic light-emitting display device. In mass production, a plurality of display device cells are prepared simultaneously. The preparing method therefore will be described, with reference to FIG. 7a to FIG. 7e.

Figure 7A:
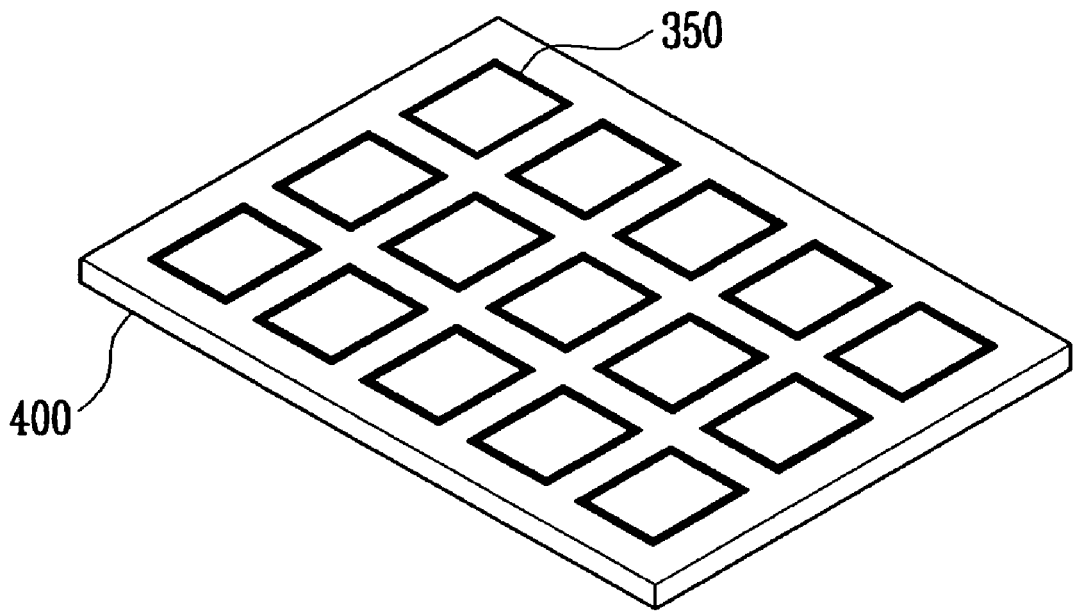
FIG. 7a to FIG. 7f are cross-sectional views showing a preparing process of an organic light-emitting display device in an original sheet unit according to one embodiment.

First, an encapsulation substrate original sheet 400 is provided. The original sheet 400 will be cut into individual encapsulation substrates as will be better understood from later description. A frit paste is applied in the form of a closed loop onto the portions of the original sheet where frit seals will be formed. The frit paste may include glass material, absorber for absorbing laser, a filler for reducing thermal expansion coefficient, and an organic binder, etc. After the frit paste is applied, the frit paste is annealed at the temperature between about 300° C. and 500° C., and the organic binder or the moisture, etc. is evaporated during the annealing process. (FIG. 7a)

Figure 7B:
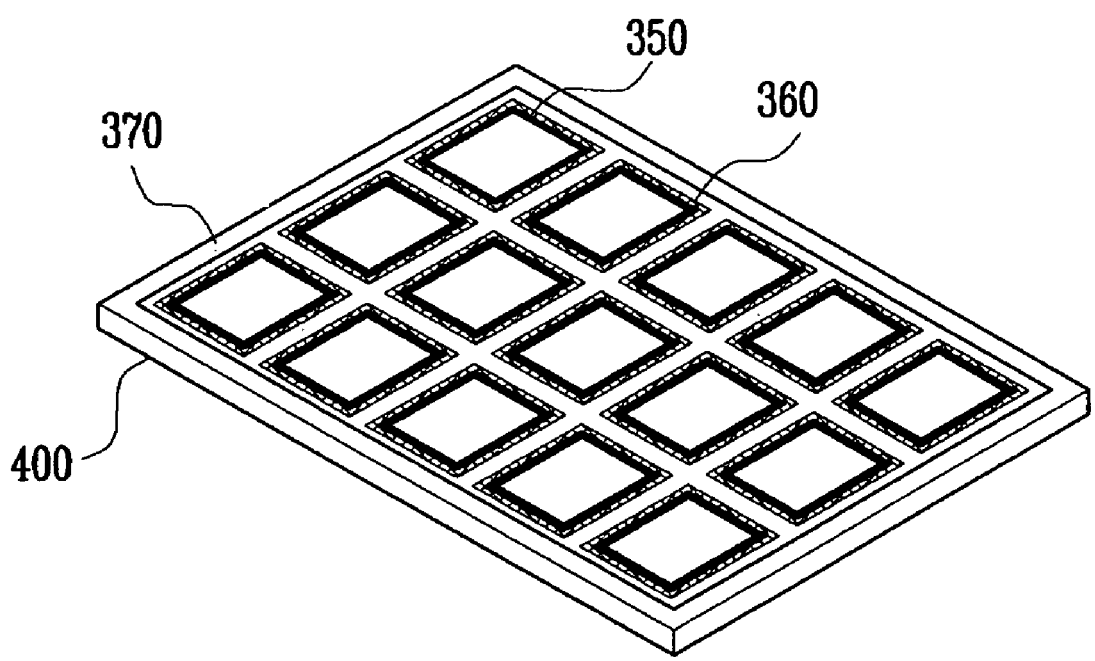

Next, the supplement member 360 including a resin is applied along the outer side of the applied frit paste 350. The supplement member 360 is formed by a dispenser or a screen print method. It can be formed by being spaced from the frit paste at a predetermined interval or contacting the frit. Also, the supplement member 360 may be formed not to protrude from the edge of the encapsulation substrate or may be formed inside from the edge. (FIG. 7b)

In one embodiment, the resin material is further formed along edges of the entire encapsulation substrate original sheet 400. Then, the original sheet encapsulating member 370 is first cured and adhered by bonding the encapsulation substrate original sheet 400 to a substrate original sheet 300. Then, a bonding process is performed. In this case, even though the bonding process of the original sheet encapsulating member 370 is progressed in a non-vacuum condition, it can prevent the inner organic light-emitting element from being exposed to the ambient air.

Figure 7C:
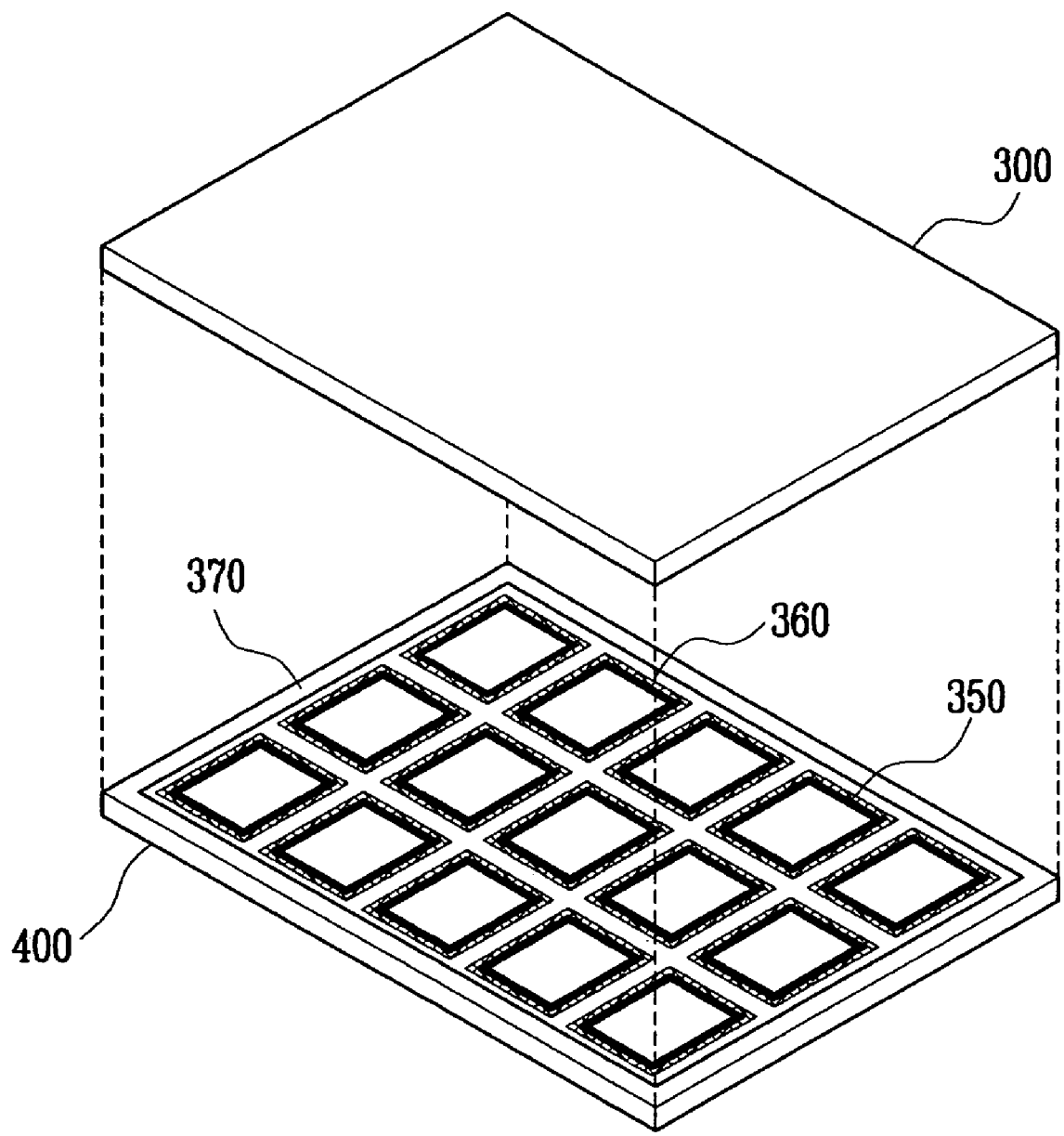

Next, the encapsulation substrate original sheet 400 on which the annealed frit 350 is formed is bonded to the substrate original sheet 300 separately prepared. At this time, the encapsulation substrate original sheet 400 is bonded so that it can cover the respective pixel regions of the substrate original sheet 300. (FIG. 7c)

Figure 7D:
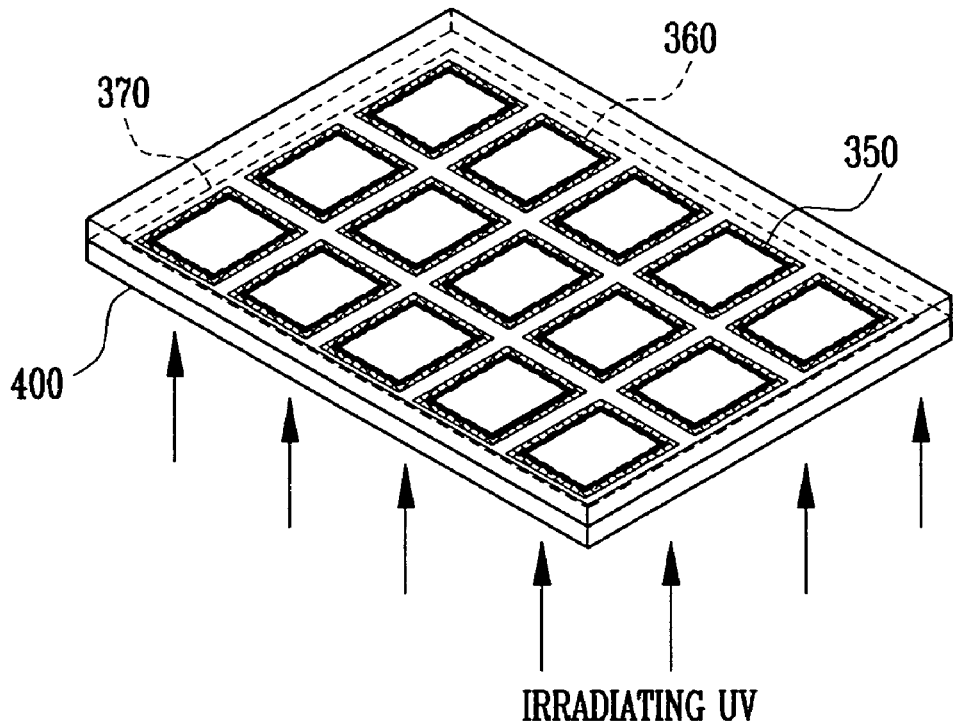

Next, the supplement member 360 is irradiated with laser or heat. The supplement member including the resin material is thereby cured, supplement the frit. (FIG. 7d)

Figure 7E:
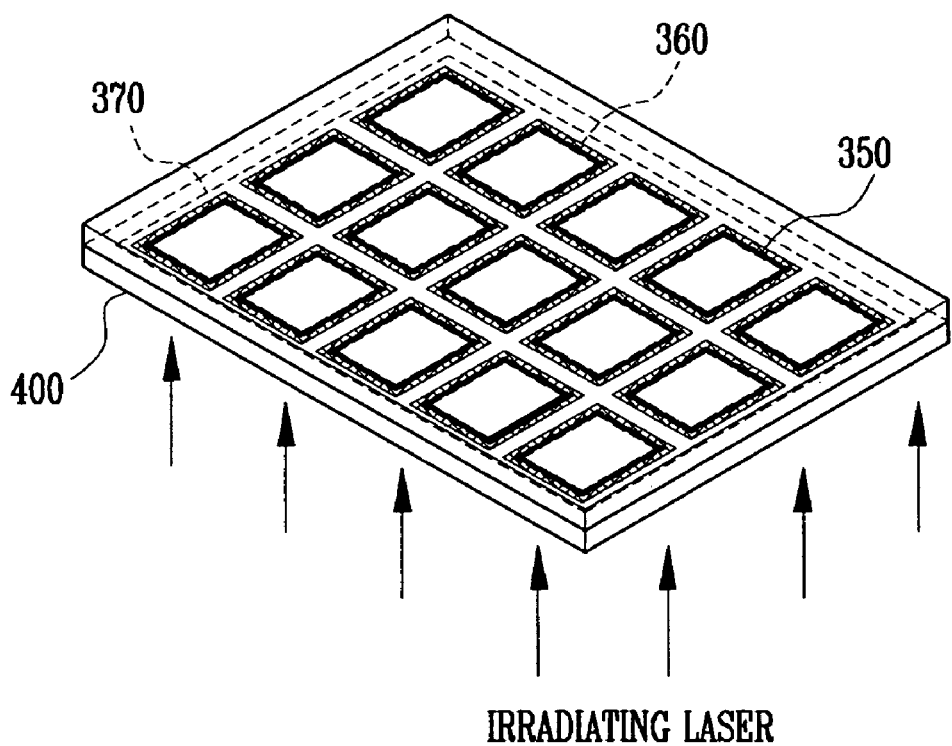

Next, the frit 350 between the substrate original sheet 300 and the original sheet 400 of the encapsulation substrate bonded to each other is irradiated with laser or infrared rays to adhere the respective substrate original sheet 300 and encapsulation substrate original sheet 400. In one embodiment, the frit 150 is melted by laser or infrared rays. The wavelength of the laser or infrared rays to be irradiated may be set to be about 810 nm. The beam size may be set to be from about 1.0 mm to about 3.0 mm in diameter. The output electric power is set to be from about 25 watt to about 45 watt. The laser can be irradiated in the direction of the encapsulation substrate side, the substrate side, or both sides thereof. Also, in one embodiment, the inside of the substrate and the encapsulation substrate in a bonded state is kept to have a pressure lower than the atmospheric pressure. (FIG. 7e)

Figure 7F:
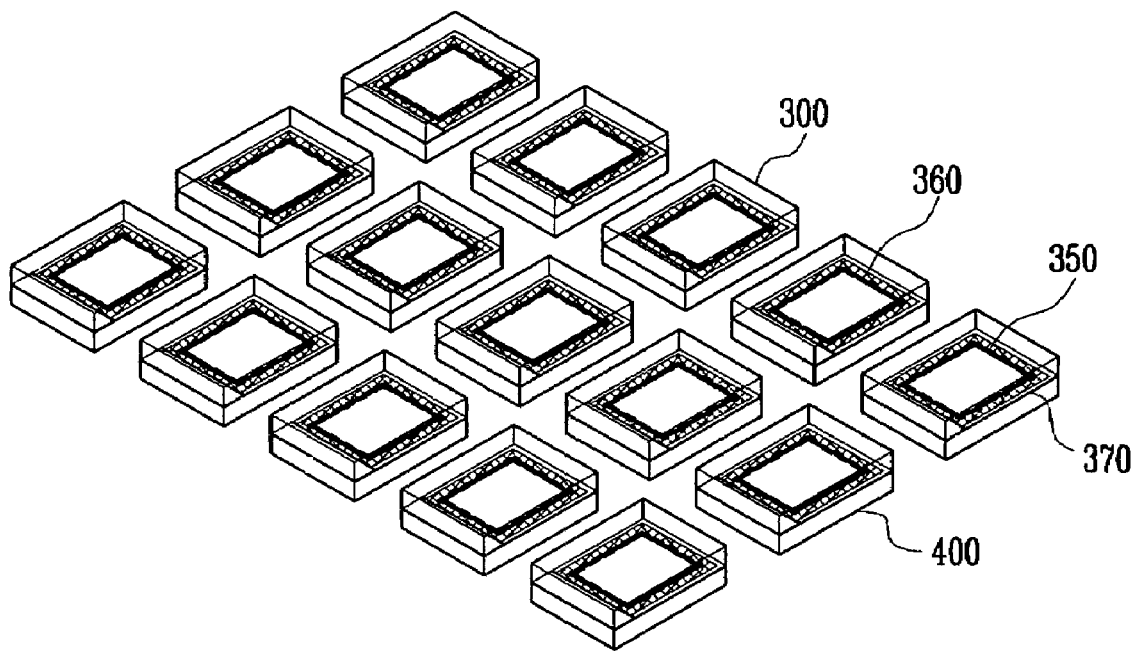

Next, an individual organic light-emitting display device can be prepared by cutting a plurality of substrate original sheets 300 and encapsulation substrate original sheets 400 in a bonded state into individual display device units. In one embodiment, a cutting line is located between respective two of the supplement members. In an embodiment where an individual encapsulation substrate is bonded only to a predetermined region of an individual substrate, only the encapsulation substrate is separately cut. (FIG. 7f)

Subsequently, after the individual panels are chamfered and washed, the substrate is provided with a driving integrated circuit. A polarizing plate is provided to a surface of the encapsulation substrate. Also, the process for applying a flexible-printed circuit and a tuppy is conducted.

In the embodiment where organic light-emitting display device are mass-produced using an original sheet as described above, a person having ordinary skill in the art will appreciate that the frit may be first cured and the supplement material may be cured later.

Although the invention is mainly described on the basis of the above embodiments, other various modifications and changes might be made without departing from the principles and spirit of the invention. For example, changes in the method for forming the supplement member and the position for forming the supplement member might be made.

Although some embodiments of the invention have been shown and described, it would be appreciated by those skilled in the art that changes might be made in this embodiment without departing from the principles and spirit of the invention that are defined in the claims and their equivalents. For example, the forming method and the forming position of the supplement member may be varied.

What is claimed is:

1. A method of making an organic light emitting display (OLED), the method comprising:
    providing a device comprising:
        a first substrate,
        a second substrate placed over the first substrate,
        an array of organic light-emitting pixels interposed between the first and second substrates,
        a frit interposed between the first and second substrates while surrounding the array, wherein the frit, the first substrate and the second substrate in combination define an enclosed space in which the array is located, and
        an uncured resin structure interposed between the first and second substrates and contacting the first and second substrates, wherein the uncured resin structure contacts or does not contact the frit seal;
    curing the uncured resin structure so as to form a reinforcing structure bonding the first and second substrates; and
    applying a laser or infrared beam to the frit so as to bond the frit to the first and second substrates.

2. The method of claim 1, wherein the resin structure comprises one or more selected from the group consisting of epoxy, acryl, and urethane resin.

3. The method of claim 1, wherein the reinforcing structure is inside the enclosed space.

4. The method of claim 1, wherein the reinforcing structure is outside the enclosed space.

5. The method of claim 1, wherein curing the uncured resin structure comprises applying UV or heat to the uncured resin structure.

6. The method of claim 1, wherein curing the uncured resin structure is conducted prior to applying the laser or infrared beam.

7. The method of claim 1, wherein curing the uncured resin structure is conducted subsequent to applying the laser or infrared beam.

8. The method of claim 1, wherein the device further comprises:
    a plurality of additional arrays of organic light-emitting pixels interposed between the first and second substrates;
    a plurality of additional frits interposed between the first and second substrates, each of the additional frits surrounding a respective one of the additional arrays; and
    a plurality of additional uncured resin structures interposed between the first and second substrates, the additional uncured resin structures being either or both of inside and outside the enclosed spaces of the additional frits.

9. The method of claim 8, further comprising:
    curing the additional uncured resin structures to form a plurality of reinforcing structures interconnecting the first and second substrates; and
    cutting the resulting product into a plurality of pieces, each comprising a cut-portion of the first substrate, a cut-portion of the second substrate, the array of organic light-emitting pixels, the frit, and the reinforcing structure.

* * * * *

UNITED STATES PATENT AND TRADEMARK OFFICE
CERTIFICATE OF CORRECTION

PATENT NO. : 8,038,495 B2
APPLICATION NO. : 11/540157
DATED : October 18, 2011
INVENTOR(S) : Lee et al.

It is certified that error appears in the above-identified patent and that said Letters Patent is hereby corrected as shown below:

At Title page 4 (Item 56), column 1, line 40, under other publications, please delete "Japananese" and insert --Japanese--, therefor.

At column 5, line 64, please delete "localdriving" and insert --local driving--, therefor.

At column 10, line 16, please delete "cellusolve," and insert --cellosolve,--, therefor.

At column 12, line 6, please delete "Sinx," and insert --SiNx,--, therefor.

Signed and Sealed this
Fourth Day of September, 2012

David J. Kappos
*Director of the United States Patent and Trademark Office*